United States Patent
Oh et al.

(10) Patent No.: US 6,927,121 B2
(45) Date of Patent: Aug. 9, 2005

(54) METHOD FOR MANUFACTURING FERROELECTRIC RANDOM ACCESS MEMORY CAPACITOR

(75) Inventors: Sang-Hyun Oh, Ichon-shi (KR); Young-Ho Yang, Ichon-shi (KR); Kye-Nam Lee, Ichon-shi (KR); Suk-Kyoung Hong, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/731,357

(22) Filed: Dec. 8, 2003

(65) Prior Publication Data
US 2004/0266095 A1 Dec. 30, 2004

(30) Foreign Application Priority Data
Jun. 30, 2003 (KR) ................................ 10-2003-0043051

(51) Int. Cl.$^7$ .......................................... H01L 21/8242
(52) U.S. Cl. ............................ 438/240; 438/3; 438/253; 438/396; 438/658; 438/660; 438/686; 438/772; 438/774
(58) Field of Search ............................ 438/3, 240, 253, 438/396, 650, 658, 660, 686, 770–772, 774

(56) References Cited

U.S. PATENT DOCUMENTS

| | | | | |
|---|---|---|---|---|
| 5,030,331 A | * | 7/1991 | Sato | 205/107 |
| 5,786,259 A | * | 7/1998 | Kang | 438/396 |
| 5,834,357 A | * | 11/1998 | Kang | 438/396 |
| 6,080,592 A | * | 6/2000 | Paz de Araujo et al. | 438/3 |
| 6,211,035 B1 | * | 4/2001 | Moise et al. | 438/396 |
| 6,407,422 B1 | | 6/2002 | Asano et al. | |
| 6,548,343 B1 | | 4/2003 | Summerfelt et al. | |
| 6,573,553 B2 | | 6/2003 | Nakamura | |
| 6,573,587 B1 | | 6/2003 | Igarashi | |
| 6,576,546 B2 | | 6/2003 | Gilbert et al. | |
| 6,596,547 B2 | | 7/2003 | Aggarwal et al. | |

* cited by examiner

Primary Examiner—Mary Wilczewski
Assistant Examiner—Toniae M. Thomas
(74) Attorney, Agent, or Firm—Blakely Sokoloff Taylor & Zafman

(57) ABSTRACT

A method for manufacturing an FeRAM capacitor is employed to enhance an adhesive property between a dielectric layer and a first bottom electrode of iridium. The method including the steps of: preparing an active matrix including a semiconductor substrate, a transistor, a bit line, a first ILD, a second ILD and a storage node; forming a first bottom electrode on the second ILD and the storage node; forming a third ILD on exposed surfaces of the first bottom electrode and the second ILD; planarizing the third ILD till a top face of the first bottom electrode is exposed; forming a second bottom electrode on the top face of the bottom electrode; forming conductive oxides on exposed sidewalls of the first bottom electrode by carrying out an oxidation process; forming a dielectric layer on exposed surfaces of the first bottom electrodes, the second bottom electrode and the second ILD; and forming a top electrode on the dielectric layer.

12 Claims, 7 Drawing Sheets

METHOD FOR MANUFACTURING FERROELECTRIC RANDOM ACCESS MEMORY CAPACITOR

FIELD OF THE INVENTION

The present invention relates to a method for manufacturing a semiconductor device; and, more particularly, to a method for manufacturing a ferroelectric random access memory (FeRAM) capacitor having an enhanced adhesive property between a bottom electrode of iridium (Ir) and a dielectric layer of a ferroelectric material.

DESCRIPTION OF THE PRIOR ART

With the recent progress of film deposition techniques, researches for a nonvolatile memory cell using a ferroelectric thin film have increasingly been developed. This nonvolatile memory cell is a high-speed rewritable nonvolatile characteristic utilizing high-speed polarization/inversion and residual polarization of a ferroelectric capacitor thin film.

Therefore, a ferroelectric random access memory (FeRAM) where a ferroelectric material such as strontium bismuth tantalate (SBT) and lead zirconium titanate (PZT) is increasingly used for the capacitor thin film in place of a conventional silicon oxide film or a silicon nitride film, because it assures a low-voltage and high-speed performance, and further, does not require a periodic refresh to prevent loss of information during standby intervals like a dynamic random access memory (DRAM).

Since a ferroelectric material has a high dielectric constant ranging from hundreds to thousands value and a stabilized residual polarization property at a room temperature, it is being applied to the FeRAM device as the capacitor thin film. In case of employing the FeRAM device, information data are stored by polarization of dipoles when electric field is applied thereto. Even if electric field is removed, the residual polarization becomes still remained so that one of information data, i.e., "0" or "1", can be stored.

There are provided in FIGS. 1A to 1D cross sectional views setting forth a conventional method for manufacturing an FeRAM capacitor. It should be noted that like parts appearing in FIGS. 1A to 1D are represented by like reference numerals.

Referring to FIG. 1A, the conventional method for manufacturing the FeRAM capacitor begins with preparing an active matrix 100 including a semiconductor substrate 110, a transistor, a bit line 124, a first ILD 122, a second ILD 126 formed on the first ILD 122 and a storage node 128 embedded in the first ILD 122 and the second ILD 126. One of the diffusion regions 118 serves as a source and the other serves as a drain.

A detailed description for providing the active matrix 100 is as followings.

To begin with, the transistor is formed on the semiconductor substrate 110, wherein the transistor is provided with a gate oxide 114, a gate electrode 116 formed upon the gate oxide 114, spacers 120 disposed on sidewalls of a gate structure, an isolation region 112 for electrically isolating elements from each other.

After formation of the transistor, the first ILD 122 is formed over a resultant structure including the transistor and the semiconductor substrate 110. Then, the bit line 124 is formed for electrically being connected to the drain in order to apply an electrical voltage thereinto, after patterning the first ILD 122 into a first predetermined configuration. Although the bit line 124 actually extends in right and left directions bypassing the storage node 128, the drawing does not show these parts of the bit line 124 for the sake of convenience.

Thereafter, the second ILD 126 is formed on exposed surfaces of the first ILD 122 and the bit line 124, wherein the bit line 124 is embedded in the second ILD 126.

Subsequently, the second ILD 126 and the first ILD 122 are selectively etched into a second predetermined configuration, whereby a contact hole (not shown) is formed. The contact hole is filled with a predetermined conductive material so as to form the storage node 128 which is connected to the source/drain regions 118. Therefore, the preparation of the active matrix 100 is completed.

After preparing the active matrix 100, a first bottom electrode 130A is formed upon the storage node 128 and portions of the second ILD 126. In general, the first bottom electrode 130A employs iridium (Ir) due to its good property for blocking oxygen diffusion.

Thereafter, a third ILD 132 is formed on exposed surfaces of the first bottom electrode 130A and the second ILD 126 and is planarized till the top face of the first bottom electrode 130A is exposed by using a method such as a chemical mechanical polishing (CMP), a blanket etch process or the like. During a planarization of the third ILD 132, the height of the third ILD 132 is unavoidably lower than that of the first bottom electrode 130A owing to a recess phenomenon of the third ILD 132, as shown in FIG. 1B. Then, a second bottom electrode 130B of platinum (Pt) is formed upon the top face of the first bottom electrode 130A, thereby obtaining a bottom electrode 130.

Subsequently, referring to FIG. 1C, a dielectric layer 134 is formed on exposed surfaces of the bottom electrode 130 and the third ILD 132 by using a method such as a spin coating technique or the like. As described already, since portions of sidewalls of the first bottom electrode 130A are inevitably exposed during the planarization of the third ILD 132, it incurs a poor adhesive property between the dielectric layer 134 and the exposed sidewalls of the first bottom electrode 130A. This is basically attributable to a worse adhesive property of Ir with respect to the ferroelectric material than the adhesive property of Pt or IrOx with respect to the ferroelectric material. Therefore, there are happened micro-voids 140 in the dielectric layer 134 at the exposed sidewalls of the first bottom electrode 130A, as shown in FIG. 1C.

Finally, a top electrode 136 is formed upon the dielectric layer 134, which is situated above the bottom electrode 130, as depicted in FIG. 1D. After a formation of the top electrode 136, an annealing process is carried out for recovering a ferroelectric property of the FeRAM capacitor. Thus, the prior art process for manufacturing the FeRAM capacitor is completed.

As aforementioned, the prior art method for manufacturing the FeRAM capacitor suffers from a drawback that there is happened a delaminating phenomenon between the first bottom electrode 130A of Ir and the dielectric layer 134 due to the recess of the third ILD 132 during the planarization thereof. Therefore, the dielectric layer 134 is delaminated at the exposed sidewalls of the first bottom electrode 130A when the dielectric layer 134 is shrunk during the annealing process. Furthermore, the delamination of the dielectric layer 134 induces the micro-voids 140 in the dielectric layer 134 so that an electrical property of the FeRAM capacitor is deteriorated in the long run.

SUMMARY OF THE INVENTION

It is, therefore, an object of the present invention to provide a method for manufacturing a ferroelectric random access memory (FeRAM) capacitor with an enhanced adhesive property between a dielectric layer of a ferroelectric material and a first bottom electrode of Ir.

In accordance with one aspect of the present invention, there is provided a method for manufacturing a ferroelectric random access memory (FeRAM) capacitor, the method including the steps of: a) preparing an active matrix including a semiconductor substrate, a transistor, a bit line, a first ILD, a second ILD and a storage node; b) forming a first bottom electrode on the second ILD and the storage node; c) forming a third ILD on exposed surfaces of the first bottom electrode and the second ILD; d) planarizing the third ILD till a top face of the first bottom electrode is exposed; e) forming a second bottom electrode on the top face of the bottom electrode; f) forming conductive oxides on exposed sidewalls of the first bottom electrode by carrying out an oxidation process; g) forming a dielectric layer on exposed surfaces of the first bottom electrodes, the second bottom electrode and the second ILD; and h) forming a top electrode on the dielectric layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1A:
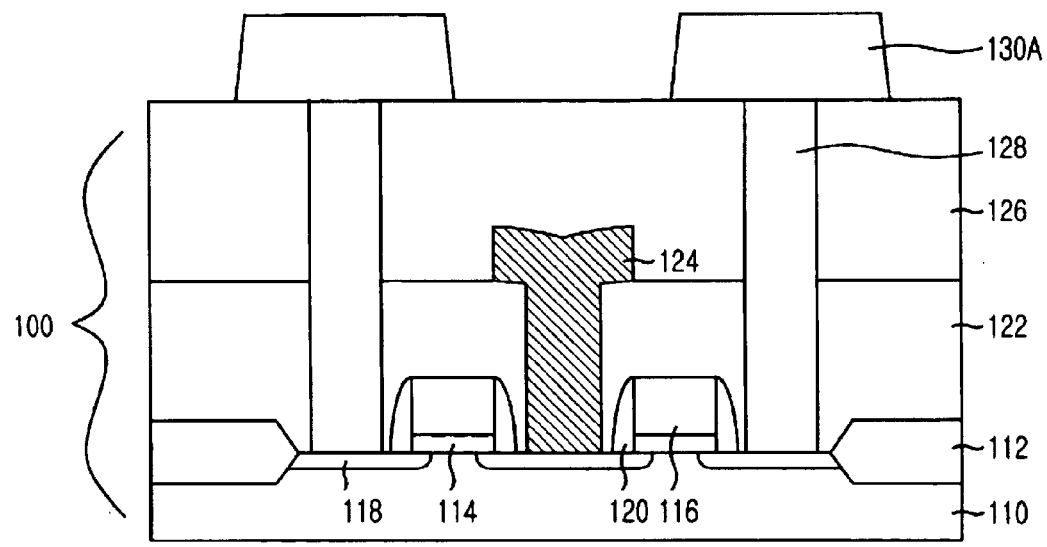
FIGS. 1A to 1D are cross sectional views setting forth a conventional method for manufacturing a ferroelectric random access memory (FeRAM) capacitor.
Figure 1B:
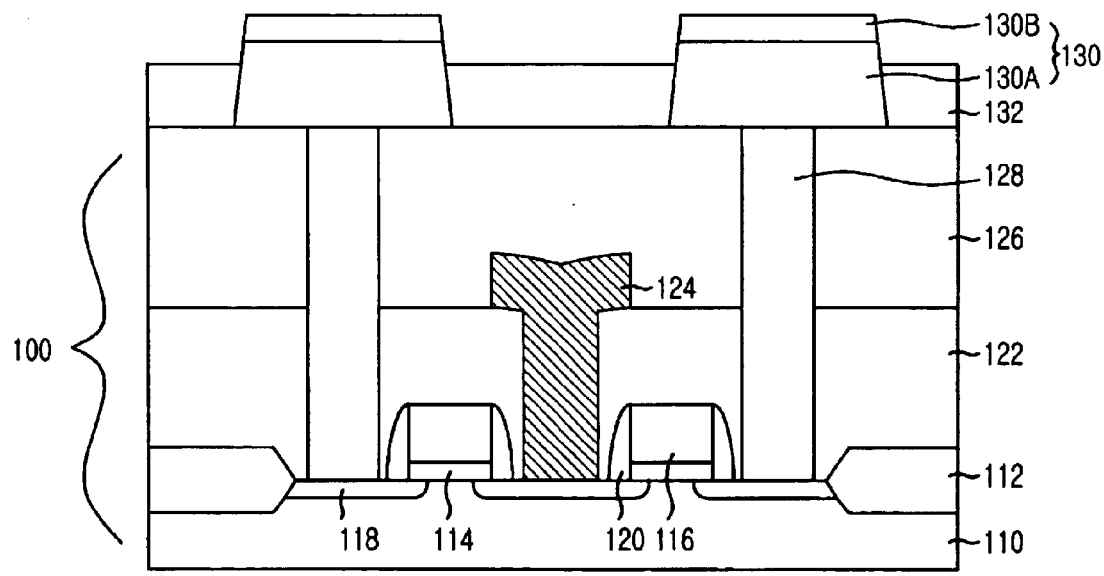
Figure 1C:
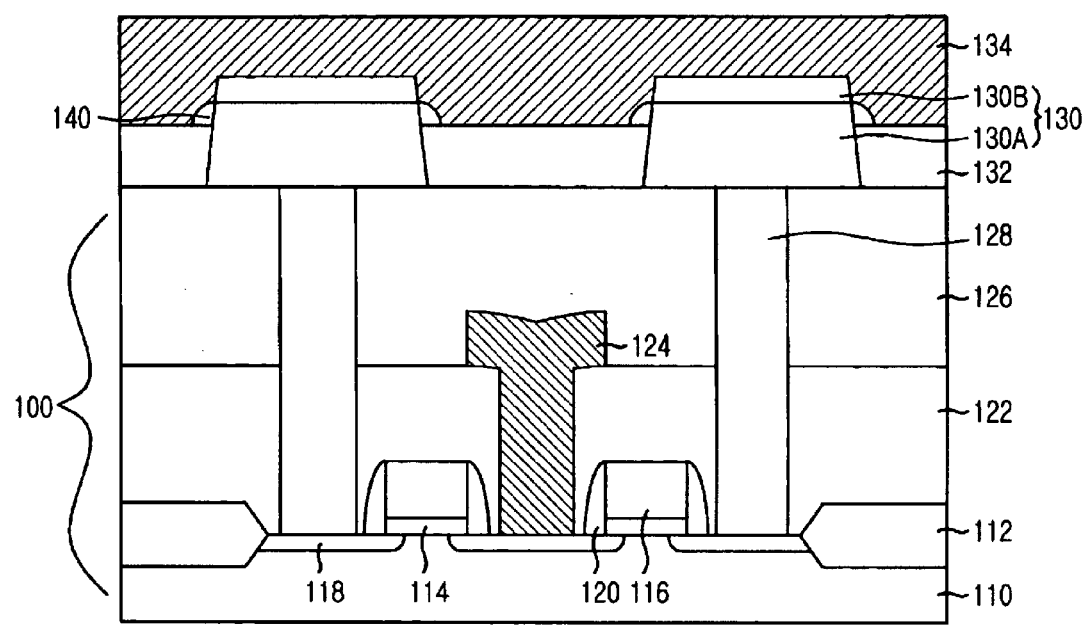
Figure 1D:
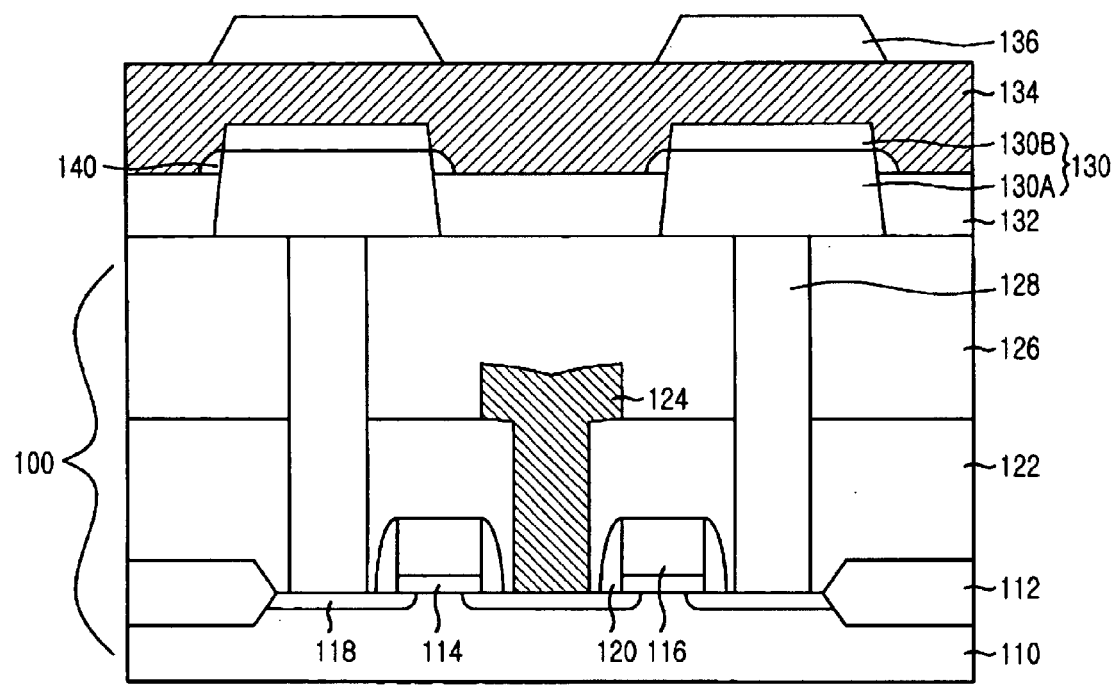

There are provided in FIGS. 2A to 2E cross sectional views setting forth a method for manufacturing a ferroelectric random access memory (FeRAM) capacitor in accordance with a preferred embodiment of the present invention. It should be noted that like parts appearing in FIGS. 2A to 2E are represented by like reference numerals.

Figure 2A:
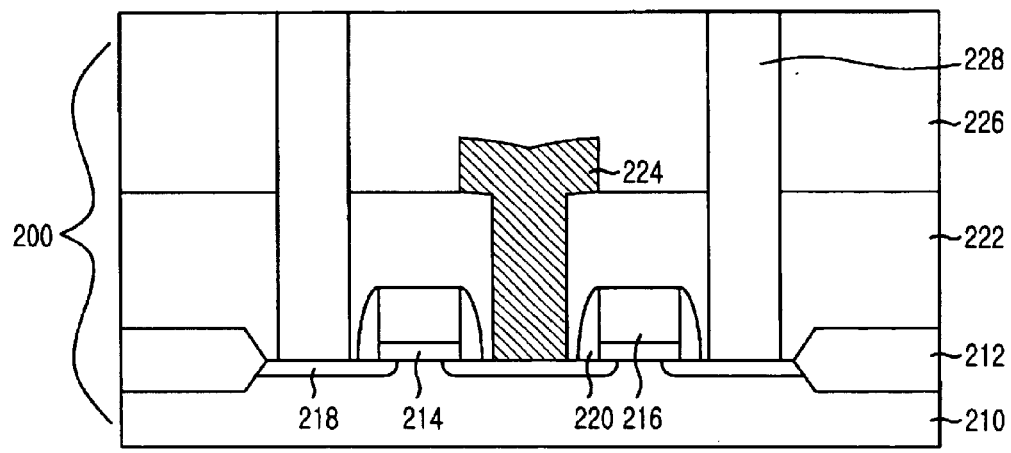
FIGS. 2A to 2E are cross sectional views setting forth a method for manufacturing an FeRAM capacitor with an enhanced adhesive property between a ferroelectric dielectric layer and a first bottom electrode of Ir in accordance with a preferred embodiment of the present invention.

Referring to FIG. 2A, a process for manufacturing the FeRAM capacitor begins with preparation of an active matrix 200 including a semiconductor substrate 210, a transistor, a bit line 224, a first ILD 222, a second ILD 226 formed on the first ILD 222 and a storage node 228 embedded in the first ILD 222 and the second ILD 226. One of the diffusion regions 218 serves as a source and the other serves as a drain.

A detailed description for providing the active matrix 200 is as followings.

To begin with, the transistor is formed on the semiconductor substrate 210, wherein the transistor is provided with a gate oxide 214, a gate electrode 216 formed upon the gate oxide 214, spacers 220 disposed on sidewalls of a gate structure, an isolation region 212 for electrically isolating the transistor and diffusion regions 218, the isolation region 218 being embedded in the semiconductor substrate 210.

After formation of the transistor, the first ILD 222 is formed on exposed surfaces of the transistor and the semiconductor substrate 210. Then, the bit line 224 is formed for electrically being connected to the drain in order to apply an electrical voltage thereinto, after patterning the first ILD 222 into a first predetermined configuration. Although the bit line 224 actually extends in right and left directions bypassing the storage node 228, the drawing does not show these parts of the bit line 224 for the sake of convenience.

Thereafter, the second ILD 226 is formed on exposed surfaces of the first ILD 222 and the bit line 224, wherein the bit line 224 is embedded in the second ILD 226.

Subsequently, the second ILD 226 and the first ILD 222 are selectively etched into a second predetermined configuration, whereby a contact hole (not shown) is formed. Then, the contact hole is filled with a predetermined conductive material so as to form the storage node 228 which is connected to the source/drain regions 218. Therefore, the preparation of the active matrix 200 is completed.

Figure 2B:
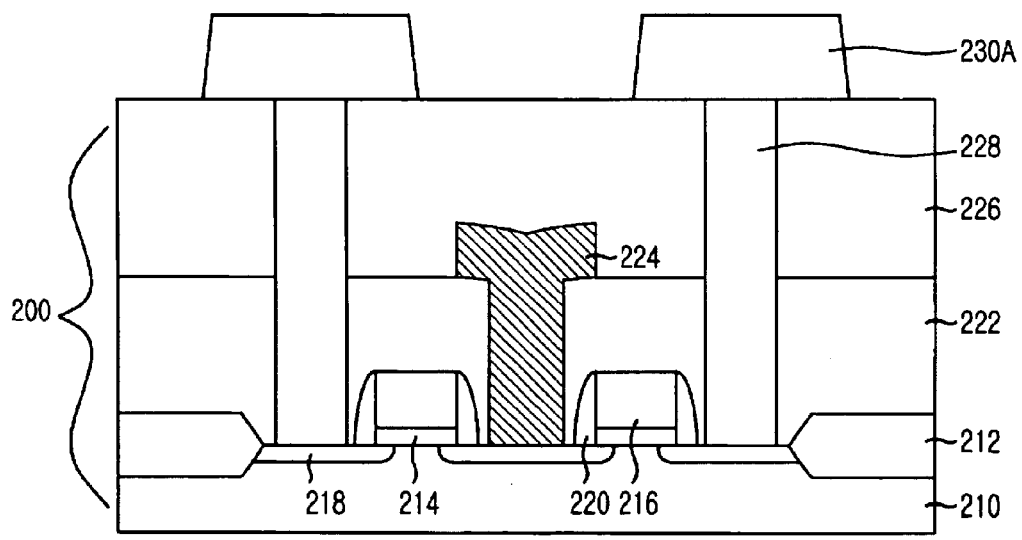

Referring to FIG. 2B, after preparing the active matrix 200, a first bottom electrode 230A is formed upon a top face of the storage node 228 and portions of the second ILD 226. In the present invention, the first bottom electrode 230A employs iridium (Ir) due to its good property for blocking oxygen diffusion.

Figure 2C:
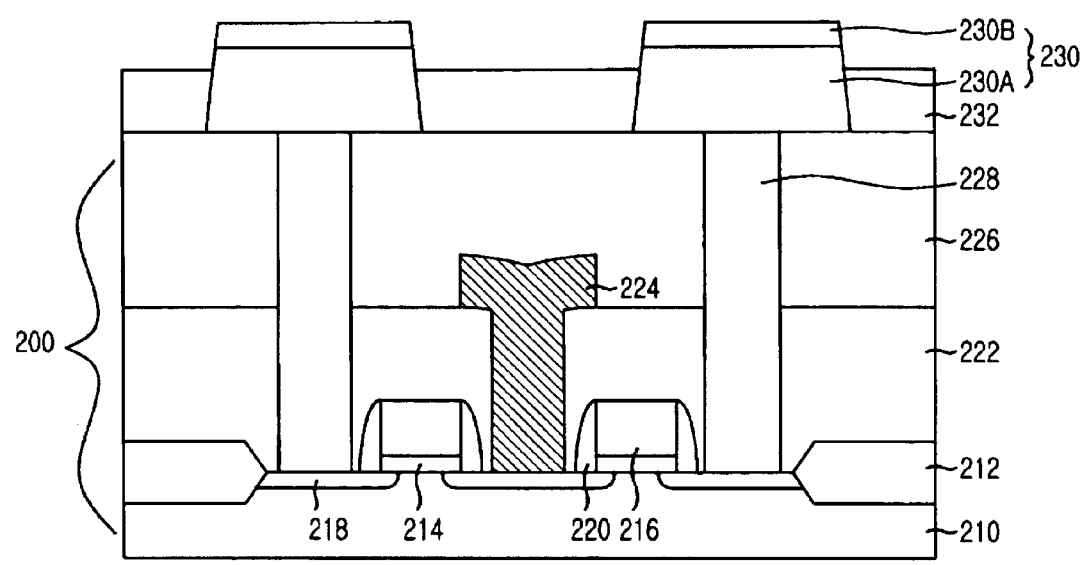

Thereafter, a third ILD 232 is formed on exposed portions of the second ILD 226 and the first bottom electrode 230A and is planarized till the top face of the first bottom electrode 230A is exposed using a method such as a chemical mechanical polishing (CMP), a blanket etch process or the like. In general, during a planarization of the third ILD 232, the height of the third ILD 232 will be unavoidably lower than that of the first bottom electrode 230A owing to a recess phenomenon of the third ILD 232, as shown in FIG. 2C.

In an ensuing step, a second bottom electrode 230B is formed upon the top face of the first bottom electrode 230A, thereby forming a composite bottom electrode 230 of Ir/Pt. Herein, the second bottom electrode 230A can be a single layer or multi-layers by using a material selected from the group consisting of platinum (Pt), iridium (Ir), iridium oxide ($IrO_x$), ruthenium (Ru), rhenium (Re), rhodium (Rh), tungsten (W), titanium (Ti) and a combination thereof.

Figure 2D:
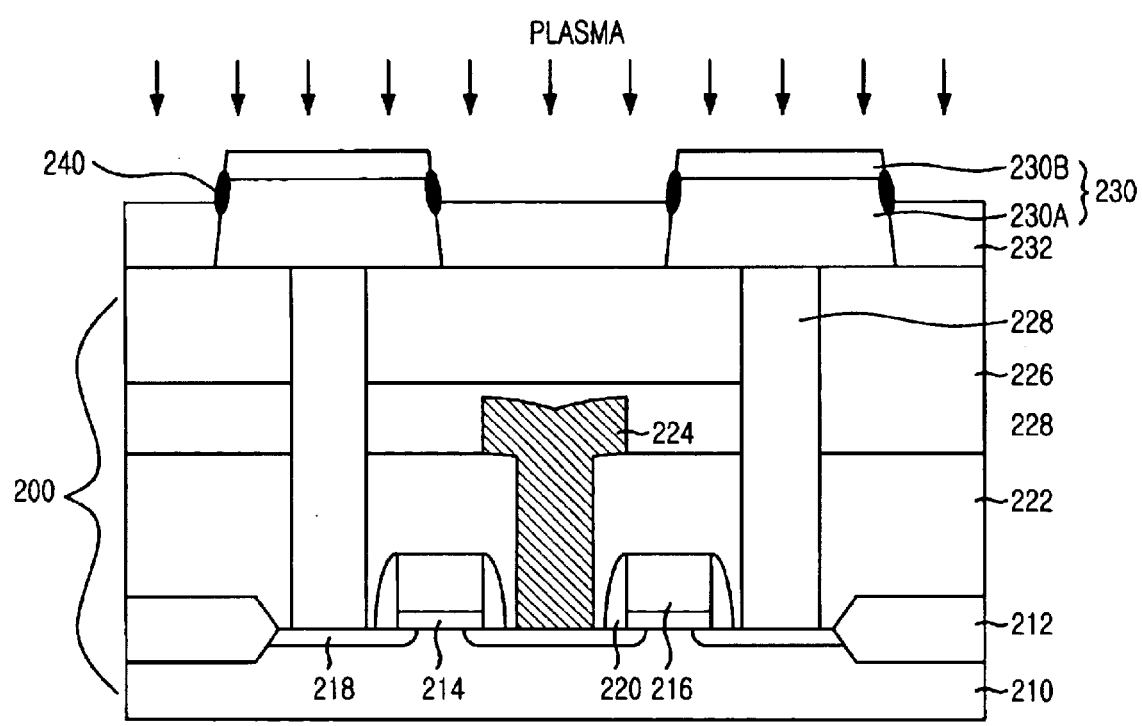

Subsequently, referring to FIG. 2D, exposed surfaces of the composite bottom electrode 230 are oxidized through an oxidation process, thereby forming a conductive oxide 240 of $IrO_x$ on sidewalls of the first bottom electrode 230A. The oxidation process is carried out by using plasma gas selected from the group consisting of oxygen ($O_2$) gas, argon (Ar) gas, nitrogen ($N_2$) gas, chlorine (Cl) gas, fluorine (F) gas and a combination thereof, at a temperature ranging from a room temperature to about 400° C. At this time, DC or RF voltage can be applied to the oxidation process. Alternatively, the oxidation process can be carried out through an annealing process in an ambient of $O_2$ gas, $N_2$ gas or a mixture gas of $O_2$ and $N_2$ at a temperature ranging from about 200° C. to about 600° C.

In a next step, referring to FIG. 2E, a dielectric layer 234 is formed on exposed surfaces of the composite bottom electrode 230 and the third ILD 232 using a method such as a spin coating technique or the like, wherein the dielectric layer 234 employs a ferroelectric material with a perovskite structure or a layered perovskite structure such as strontium bismuth tantalate ($SrBi_2Ta_2O_9$, hereinafter referred to as SBT), lanthanum (La)-modified bismuth titanate ((Bi,La)$_4Ti_3O_{12}$, hereinafter referred to as BLT), lead zirconium titanate ((Pb,Zr)$TiO_3$, hereinafter referred to as PZT), neodymium (Nd)-modified bismuth titanate ((Bi,Nd)

$_4Ti_3O_{12}$, hereinafter referred to as BNdT), vanadium (V)-modified bismuth titanate ($(Bi,V)_4Ti_3O_{12}$, hereinafter referred to as BVT) or the like. In utilizing the ferroelectric material, the ferroelectric material doped with impurities can be used for the dielectric layer 234.

Figure 2E:
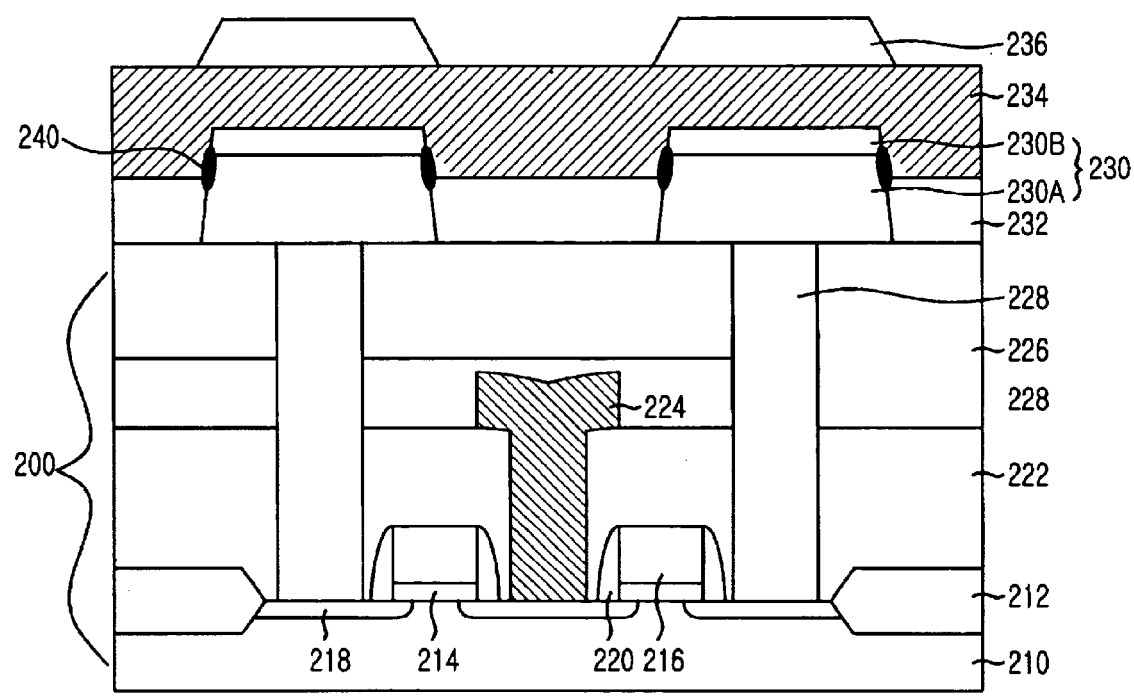

Finally, a top electrode 236 is formed upon the dielectric layer 234, which is situated above the composite bottom electrode 230, as depicted in FIG. 2E. The top electrode 236 can be a single layer or multi-layers by employing a material selected from the group consisting of Pt, Ir, $IrO_x$, Ru, Re, Rh, W, Ti and a combination thereof. After a formation of the top electrode 236, an annealing process is carried out for recovering a ferroelectric property of the FeRAM capacitor. Thus, the inventive process for manufacturing the FeRAM capacitor is completed.

In comparison with the prior art method, the exposed sidewalls of the first bottom electrode 230A of Ir are oxidized through the plasma process or the annealing process before a formation of the dielectric layer 234, whereby the conductive oxide 240 of $IrO_x$ is formed on the exposed sidewalls of the first bottom electrode 230A. While Ir has a poor adhesive property with respect to the dielectric layer 234, $IrO_x$ has a good adhesive property. Therefore, a delaminating phenomenon introduced between the exposed sidewalls of the first bottom electrode 230A and the dielectric layer 234, which is a serious problem in the prior art, can be effectively prevented in accordance with the present invention owing to the conductive oxides 240 of $IrO_x$. Furthermore, micro-voids in the dielectric layer 234 which is introduced due to the delaminating phenomenon can be also removed with effect, whereby it is possible to obtain a reliable and an enhanced FeRAM capacitor.

While the present invention has been described with respect to the particular embodiments, it will be apparent to those skilled in the art that various changes and modifications may be made without departing from the scope of the invention as defined in the following claims.

What is claimed is:

1. A method for manufacturing a ferroelectric random access memory (FeRAM) capacitor, the method comprising the steps of:
   a) preparing an active matrix obtained by a predetermined process, the active matrix including a semiconductor substrate, a transistor, a bit line, a first inter layer dielectric (ILD), a second ILD and a storage node;
   b) forming a first bottom electrode on the second ILD and the storage node;
   c) forming a third ILD on exposed surfaces of the first bottom electrode and the second ILD;
   d) planarizing the third ILD until a top face and upper sidewalls of the first bottom electrode are exposed;
   e) forming a second bottom electrode on the top face of the first bottom electrode, the first bottom electrode and second bottom electrode together being a composite bottom electrode;
   f) forming conductive oxides on exposed sidewalls of the first bottom electrode by carrying out an oxidation process;
   g) forming a dielectric layer on exposed surfaces of the composite bottom electrode and the third ILD; and
   h) forming a top electrode on the dielectric layer.

2. The method as recited in claim 1, wherein the step d) is carried out by using a chemical mechanical polishing (CMP) method.

3. The method as recited in claim 1, wherein the step d) is carried out by using a blanket etch method.

4. The method as recited in claim 1, wherein the first bottom electrode uses iridium (Ir).

5. The method as recited in claim 1, wherein the second bottom electrode employs a material selected from the group consisting of platinum (Pt), iridium (Ir), iridium oxide ($IrO_x$), ruthenium (Ru), rhenium (Re), rhodium (Rh), tungsten (W), titanium (Ti) and a combination thereof.

6. The method as recited in claim 1, wherein the dielectric layer uses a ferroelectric material selected from the group consisting of strontium bismuth tantalate ($SrBi_2Ta_2O_9$, SBT), lanthanum (La)-modified bismuth titanate (($Bi,La$)$_4Ti_3O_{12}$, BLT) and lead zirconium titanate (($Pb,Zr$)$TiO_3$, PZT), neodymium (Nd)-modified bismuth titanate (($Bi,Nd$)$_4Ti_3O_{12}$, BNdT) and vanadium (V)-modified bismuth titanate (($Bi,V$)$_4Ti_3O_{12}$, BVT).

7. The method as recited in claim 6, wherein the ferroelectric material has a perovskite crystal structure.

8. The method as recited in claim 6, wherein the ferroelectric material has a layered perovskite crystal structure.

9. The method as recited in claim 1, wherein the top electrode employs a material selected from the group consisting of Pt, Ir, $IrO_x$, Ru, Re, Rh, W, Ti and a combination thereof.

10. The method as recited in claim 1, wherein the oxidation process is carried out by using a plasma gas.

11. The method as recited in claim 10, wherein the oxidation process is carried out by using plasma gas selected from the group consisting of oxygen ($O_2$) gas, argon (Ar) gas, nitrogen ($N_2$) gas, chlorine (Cl) gas, fluorine (F) gas and a combination thereof at a temperature ranging from a room temperature to about 400° C.

12. The method as recited in claim 1, wherein the oxidation process is carried out through an annealing process in an ambient of a gas selected from the group consisting of $O_2$, $N_2$ and a combination thereof, at a temperature ranging from about 200° C. to about 600° C.

* * * * *